(12) United States Patent
Hwang et al.

(10) Patent No.: US 9,870,950 B2
(45) Date of Patent: Jan. 16, 2018

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Chang-Sun Hwang, Hwaseong-si (KR); Ja-Eung Koo, Yongin-si (KR); Jong-Hyung Park, Gunpo-si (KR); Ho-Young Kim, Seongnam-si (KR); Leian Bartolome, Hwaseong-si (KR); Bo-Un Yoon, Seoul (KR); Hyoung-Bin Moon, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/371,646

(22) Filed: Dec. 7, 2016

(65) Prior Publication Data
US 2017/0170072 A1    Jun. 15, 2017

(30) Foreign Application Priority Data

Dec. 9, 2015  (KR) .................. 10-2015-0175351

(51) Int. Cl.
*H01L 21/8234* (2006.01)
*H01L 21/28* (2006.01)
*H01L 21/3105* (2006.01)
*H01L 29/66* (2006.01)

(52) U.S. Cl.
CPC ............. *H01L 21/823456* (2013.01); *H01L 21/28008* (2013.01); *H01L 21/823431* (2013.01); *H01L 21/823481* (2013.01); *H01L 21/31053* (2013.01); *H01L 29/66545* (2013.01)

(58) Field of Classification Search
CPC ........... H01L 21/31053; H01L 21/3212; H01L 21/02074; H01L 21/76229; H01L 21/31111
See application file for complete search history.

(56) References Cited

U.S. PATENT DOCUMENTS

| | | | |
|---|---|---|---|
| 8,647,937 B2 * | 2/2014 | Toh | ............... H01L 29/66545 438/183 |
| 8,847,281 B2 | 9/2014 | Cea et al. | |
| 9,035,397 B2 | 5/2015 | Li et al. | |

(Continued)

*Primary Examiner* — Eliseo Ramos Feliciano
*Assistant Examiner* — Joannie A Garcia
(74) *Attorney, Agent, or Firm* — F. Chau & Associates, LLC

(57) ABSTRACT

A method of manufacturing a semiconductor device according to one or more exemplary embodiments of the present inventive concept includes forming a plurality of dummy gates on a substrate. Each of the dummy gates includes a gate mask disposed on an upper surface of each of the dummy gates. A spacer is disposed on at least two sides of the dummy gates. An insulating interlayer is formed on the gate mask and the spacer. A first polishing including chemical mechanical polishing is performed on portions of the gate mask and the insulating interlayer by using a slurry composite having a first mixing ratio. A second polishing including chemical mechanical polishing is formed on remaining portions of the gate mask and the insulating interlayer to expose upper surfaces of the plurality of dummy gates, by using a slurry composite having a second mixing ratio.

20 Claims, 6 Drawing Sheets

(56) References Cited

U.S. PATENT DOCUMENTS

| | | |
|---|---|---|
| 9,117,908 B2 | 8/2015 | Xie et al. |
| 9,230,913 B1* | 1/2016 | Senapati ............... H01L 23/528 |
| 2008/0086950 A1* | 4/2008 | Kon ........................ C09G 1/02 |
| | | 51/306 |
| 2013/0189841 A1* | 7/2013 | Balseanu ........ H01L 21/823807 |
| | | 438/692 |
| 2015/0115372 A1 | 4/2015 | Yang et al. |
| 2015/0171216 A1* | 6/2015 | Xie .................... H01L 21/0217 |
| | | 257/401 |
| 2015/0187594 A1 | 7/2015 | Tu et al. |
| 2015/0255542 A1 | 9/2015 | Cai et al. |
| 2017/0009102 A1* | 1/2017 | Hoshi ................... B24B 37/044 |

\* cited by examiner

FIRST REGION | SECOND REGION

FIRST REGION | SECOND REGION

METHOD OF MANUFACTURING SEMICONDUCTOR DEVICE

CROSS-REFERENCE TO RELATED APPLICATION

This application claims priority under 35 U.S.C. §119 to Korean Patent Application No. 10-2015-0175351, filed on Dec. 9, 2015, in the Korean Intellectual Property Office, the disclosure of which is incorporated by reference herein in its entirety.

TECHNICAL FIELD

Exemplary embodiments of the present inventive concept relate to a semiconductor device, and more particularly to a method of manufacturing a semiconductor device.

DISCUSSION OF RELATED ART

Semiconductor devices may be manufactured using a replacement metal gate process called a gate last scheme. Semiconductor devices may be manufactured using a process of forming a gate insulating film and a gate electrode in a trench formed by removing a dummy gate.

SUMMARY

An exemplary embodiment of the present inventive concept provides a method of manufacturing a semiconductor device using a chemical mechanical polishing process capable of non-selectively polishing a silicon nitride film and a silicon oxide film, by which a manufacturing process may be simplified and a manufacturing cost may be reduced.

According to an exemplary embodiment of the present inventive concept, a method of manufacturing a semiconductor device includes forming a plurality of dummy gates on a substrate. Each of the dummy gates includes a gate mask disposed on an upper surface of each of the dummy gates. A spacer is disposed on at least two sides of the dummy gates. An insulating interlayer is formed on the gate mask and the spacer. A first polishing including chemical mechanical polishing is performed on portions of the gate mask and the insulating interlayer by using a slurry composite having a first mixing ratio. A second polishing including chemical mechanical polishing is formed on remaining portions of the gate mask and the insulating interlayer to expose upper surfaces of the plurality of dummy gates, by using a slurry composite having a second mixing ratio.

According to an exemplary embodiment of the present inventive concept, a method of manufacturing a semiconductor device includes forming a plurality of dummy gates on a substrate. Each of the dummy gates includes a gate mask disposed on an upper surface of each of the dummy gates. A spacer is disposed on at least two sides of the dummy gates. An insulating interlayer is formed on the gate mask and the spacer. A first polishing including chemical mechanical polishing is performed on portions of the gate mask and the insulating interlayer by using a slurry composite having a first mixing ratio. The slurry composite includes an abrasive and an additive. The slurry composite is dispersed in a solvent. The first mixing ratio of the abrasive and the additive is a ratio of about 1:2. A second polishing including chemical mechanical polishing is formed on remaining portions of the gate mask and the insulating interlayer to expose upper surfaces of the plurality of dummy gates, by using a slurry composite having a second mixing ratio. The second mixing ratio of the abrasive and the additive is a ratio of about 1:3.

According to an exemplary embodiment of the present inventive concept, a method of manufacturing a semiconductor device includes providing a substrate including a first region and a second region. A plurality of dummy gates is formed on the substrate. Each of the dummy gates includes a gate mask disposed on an upper surface of each dummy gate. A spacer is disposed on opposite side surfaces of each dummy gate. Each of the dummy gates has a first width in the first region and a second width in the second region. An insulating interlayer is formed on the gate mask and the spacer. A first polishing including chemical mechanical polishing is performed on portions of the gate mask and the insulating interlayer by using a slurry composite having a first mixing ratio. A second polishing including chemical mechanical polishing is performed on remaining portions of the gate mask and the insulating interlayer to stop polishing on the upper surfaces of the dummy gates, by using a slurry composite having a second mixing ratio. A trench is formed exposing the substrate by removing the dummy gate. A gate insulating film is formed on a lower surface of the trench. A gate electrode is formed on the gate insulating film.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1:
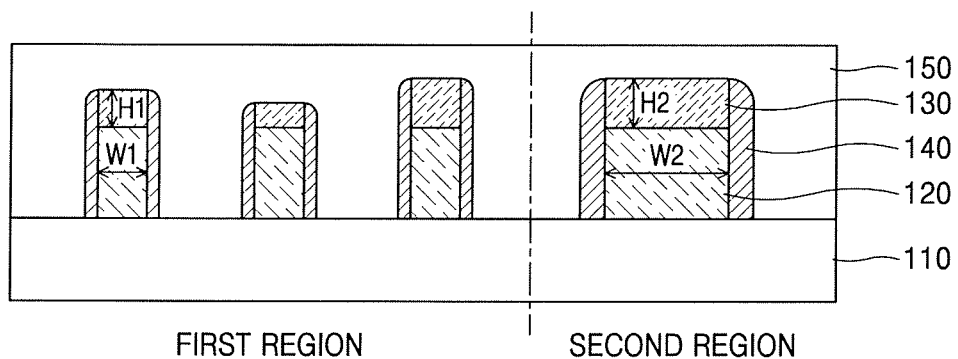
FIGS. 1 to 8 are cross-sectional views illustrating a method of manufacturing a semiconductor device according to an exemplary embodiment of the present inventive concept.

Exemplary embodiments of the present inventive concept will be described in more detail below with reference to the accompanying drawings, in which exemplary embodiments of the present inventive concept are shown. Exemplary embodiments of the present inventive concept may, however, be embodied in many different forms and should not be construed as limited to the embodiments set forth herein.

In the specification and drawings, like reference numerals may denote like elements.

In a case where any embodiment can be implemented differently, an order of a specified process may be performed in a manner different from an order described.

As such, variations from the shapes of the illustrations as a result, for example, of manufacturing techniques and/or tolerances, may occur.

FIGS. 1 to 8 are cross-sectional views illustrating a method of manufacturing a semiconductor device according to an exemplary embodiment of the present inventive concept.

Referring to FIG. 1, a plurality of dummy gates 120 including polysilicon may be formed on a substrate 110 including a first region and a second region to form a replacement metal gate of a device to which a gate last scheme is applied. A gate mask 130 including a silicon nitride film may be formed on each of the plurality of dummy gates 120. A spacer 140 including a silicon nitride film may be formed on at least two side surfaces of each of the plurality of dummy gates 120. An insulating interlayer 150 including a silicon oxide film may be formed covering the gate mask 130 and the spacer 140.

A dummy gate formation layer may be formed on the substrate 110, and a gate mask formation layer may be formed on the dummy gate formation layer. A mask pattern for forming the plurality of dummy gates 120 and the gate mask 130 may be formed on the gate mask formation layer. The plurality of dummy gates 120 and the gate mask 130 may be formed on the substrate 110 by etching the gate mask formation layer and the dummy gate formation layer by using the mask pattern as an etching mask. A spacer formation film covering the plurality of dummy gates 120 and the gate mask 130 may be formed. A spacer 140 may be formed on at least two side surfaces of the plurality of dummy gates 120 and the gate mask 130 by performing anisotropic etching on the spacer formation film.

The substrate 110 may be a semiconductor substrate. In some exemplary embodiments of the present inventive concept, the substrate 110 may include a semiconductor material such as Si or Ge. In some exemplary embodiments of the present inventive concept, the substrate 110 may include a compound semiconductor such as SiGe, SiC, GaAs, InAs, or InP. In some exemplary embodiments of the present inventive concept, the substrate 110 may have a silicon on insulator (SOI) configuration.

The substrate 110 may include a conductive region, for example, a well doped with impurities or a structure doped with impurities. The substrate 110 may have various element isolation structures such as a shallow trench isolation (STI) structure. The substrate 110 may be a silicon substrate; however, exemplary embodiments of the present inventive concept are not limited thereto.

The substrate 110 may include a first region and a second region. In some exemplary embodiments of the present inventive concept, the first region may be a cell region, and the second region may be a peripheral circuit region. Alternatively, the first region may be a region in which patterns arranged in a relatively high density are formed, and the second region may be a region in which patterns arranged in a relatively low density are formed.

The dummy gate 120 may include, for example, silicon. The dummy gate 120 may include polysilicon, amorphous silicon, or a combination thereof. Polysilicon may be deposited using, for example, a chemical vapor deposition (CVD) method, and amorphous silicon may be deposited using, for example, sputtering, chemical vapor deposition, or plasma vapor deposition, but exemplary embodiments of the present inventive concept are not limited thereto. The dummy gate 120 may include polysilicon; however, exemplary embodiments of the present inventive concept are not limited thereto.

The dummy gate 120 may have a first width W1 in the first region and to have a second width W2 in the second region. The dummy gate 120 may have substantially the same width in the same region. Alternatively, the dummy gate 120 may have different widths even in the same region. The second width W2 of the dummy gate 120 formed in the second region may be larger than the first width W1 of the dummy gate 120 formed in the first region, but exemplary embodiments of the present inventive concept are not limited thereto.

The gate mask 130 may include, for example, a silicon nitride film, a silicon oxide film, or a combination thereof. The gate mask 130 may be formed by, for example, chemical vapor deposition.

The height and width of the gate mask 130 may vary depending on the dummy gate 120. As the width of the dummy gate 120 increases, the width of the gate mask 130 may increase. The height of the gate mask 130 may be a first height H1 in the first region and may be a second height 112 in the second region. However, the height of the gate mask 130 may vary even in the same region. For example, the height of the gate mask 130 may vary due to a loading effect occurring depending on a pattern density of the dummy gate 120. The height of the gate mask 130 may vary depending on an overlay margin of a mask during an exposure process.

The spacer 140 may include, for example, a silicon nitride film, a silicon oxide film, or a combination thereof. The spacer 140 may be formed by, for example, chemical vapor deposition. In a manufacturing method according to an exemplary embodiment of the present inventive concept described in more detail below, the gate mask 130 and the spacer 140 may be substantially simultaneously polished and removed, and thus the gate mask 130 and the spacer 140 may include the same slurry composite and may include materials that are polished in the same process conditions.

According to an exemplary embodiment of the present inventive concept, when the gate mask 130 and the spacer 140 are polished, the gate mask 130 and the spacer 140 may have a polishing ratio similar to that of another material located in the vicinity thereof, for example, the insulating interlayer 150. A material satisfying the above-mentioned conditions may be selected as the gate mask 130 and the spacer 140. The gate mask 130 and the spacer 140 may include silicon nitride films; however, exemplary embodiments of the present inventive concept are not limited thereto.

The insulating interlayer 150 may include a material with a relatively low dielectric constant of equal to or less than 9, for example, a silicon oxide film, a silicon oxynitride film, or a combination thereof. The insulating interlayer 150 may include, for example, flowable Oxide (FOX), undoped silica glass (USG), borosilica glass (BSG), high density plasma (HDP), plasma enhanced oxide (PEOX), or flowable CVD (FCVD). The insulating interlayer 150 may include a silicon oxide film; however, exemplary embodiments of the present inventive concept are not limited thereto.

Figure 2:
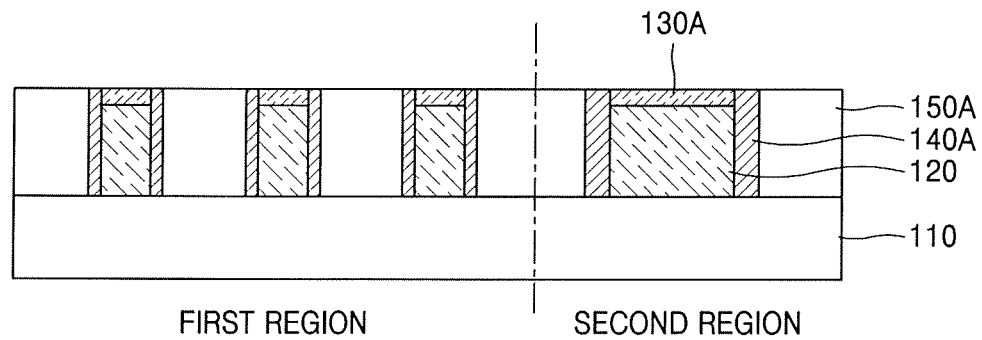

Referring to FIG. 2, a first polishing may be performed on portions of the insulating interlayer 150, the gate mask 130, and the spacer 140 using a slurry composite having a first mixing ratio through a chemical mechanical polishing process, thus forming an insulating interlayer 150A having been subjected to the first polishing, a gate mask 130A having been subjected to the first polishing, and a spacer 140A having been subjected to the first polishing.

One or more exemplary embodiments of the present inventive concept include a first polishing process and a second polishing process. In the first polishing process and the second polishing process, slurry composites having substantially the same components may be used by making only mixing ratios thereof different from each other.

According to one or more exemplary embodiments of the present inventive concept, non-selective polishing may be performed on a silicon nitride film and a silicon oxide film by adjusting a mixing ratio of a slurry composite. The slurry composite may include an abrasive, an additive capable of adjusting a polishing selection ratio, and the balance of the slurry composite may be a solvent. The first mixing ratio of the abrasive to the additive may be a ratio of approximately 0.95 to approximately 1.05. Alternatively, the first mixing ratio of the abrasive to the additive may be a ratio of approximately 1.9 to approximately 2.1. The first mixing ratio of the slurry composite may be controlled to satisfy the mixing ratio within an error range of about 5%. As an example, the first mixing ratio of the abrasive and the additive may a ratio of about 1:2.

The slurry composite will be described in more detail below.

The abrasive may include a metal oxide such as silica ($SiO_2$), alumina ($Al_2O_3$), ceria ($CeO_2$), zirconia ($ZrO_2$), or titania ($TiO_2$). The metal oxides may be used as an abrasive in a mixture of two or more types thereof.

The size of polishing particles of the abrasive may be from about 3 nm to about 300 nm. The size of each particle refers to a diameter which is a maximum value of a distance between two points within each particle. Regarding an average diameter of the polishing particle, when the size of the particle is excessively small, a polishing speed for flattening a substrate may be reduced. On the other hand, when the size of the particle is excessively large, the stability of dispersion deteriorates, and flattening may be underperformed, and a mechanical defect such as a scratch may be generated in a polishing surface. Thus, the average diameter may be from about 3 nm to about 300 nm, thus reducing or eliminating under or over flattening. However, exemplary embodiments of the present inventive concept are not limited to a particular polishing particle size.

The additive may include a silicon nitride film polishing accelerator, a polysilicon film polishing restrainer, a silicon oxide film polishing regulator, and a planarization regulator.

The silicon nitride film polishing accelerator may include at least one selected from isoleucine, alanine, glycine, glutamine, threonine, serine, asparagine, tyrosine, cysteine, valine, and leucine.

When the content of the silicon nitride film polishing accelerator is excessively small, an expected effect obtained by adding the silicon nitride film polishing accelerator, that is, an effect of increasing a polishing speed of a silicon nitride film may be insufficient. When the content of the silicon nitride film polishing accelerator is excessively large, it may be difficult to set a polishing selection ratio for a silicon oxide film.

The polysilicon film polishing restrainer may include an anionic polymer including at least one selected from polyacrylic acid, polyacrylic acid ammonium salt, polymethacrylic acid, polymethacrylic acid ammonium salt, and poly acrylic maleic acid.

When the content of the polysilicon film polishing restrainer is excessively small, an expected effect obtained by the adding the polysilicon film polishing restrainer, that is, an effect of suppressing a polishing speed of a polysilicon film may be insufficient. When the content of the polysilicon film polishing restrainer is excessively large, it may be possible to hinder the operation of the silicon nitride film polishing accelerator.

The silicon oxide film polishing regulator may include at least one selected from 1-2-hydroxyethyl-2-pyrrolidone, 4-hydroxyethyl-2-pyrrolidone, maleic anhydride, maleic hydrazide, and malemide.

When the content of the silicon oxide film polishing regulator is excessively small, an expected effect obtained by adding the silicon oxide film polishing regulator, that is, an effect of adjusting a polishing speed of a silicon oxide film may be insufficient. When the content of the silicon oxide film polishing regulator is excessively large, it may be possible to hinder the operation of the polysilicon film polishing restrainer.

The planarization regulator may include a nonionic polymer including at least one selected from polyvinyl alcohol (PVA), ethylene glycol (EG), glycerin, polyethylene glycol (PEG), polypropylene glycol (PPG), and polyvinyl pyrrolidone (PVP).

The planarization regulator may reduce a difference between polishing ratios depending on a difference in pattern density.

Deionized water may be used as the solvent. The solvent may refer to a solvent in a relationship between a material which is completely dissolved within a solvent such as a silicon nitride film polishing accelerator and/or a polysilicon film polishing restrainer. The solvent may serve as a dispersion medium in a relationship with minute metal particles such as an abrasive. The solvent may serve as both a solvent and a dispersion medium, but may be collectively referred to as a solvent.

When the first polishing process is performed using the slurry composite obtained by mixing at the first mixing ratio, a polishing ratio of a silicon nitride film to a silicon oxide film may be approximately 1:1 to approximately 2:1. Thus, the non-selective polishing of the silicon nitride film and the silicon oxide film may be performed.

Thus, in a process of forming the insulating interlayer 150 including a silicon nitride film and forming the gate mask 130 and the spacer 140 including a silicon nitride film using the first polishing process, polishing may be performed at a similar ratio in spite of a difference between materials, and thus flattening may be consistently performed.

The first polishing process may be performed for a certain period of time so that upper surfaces of the plurality of dummy gates are not exposed. That is, the polishing process may be performed for a designated period of time by designating a certain period of time in a chemical mechanical polishing equipment without controlling the polishing process using an etching stop film.

Figure 3:
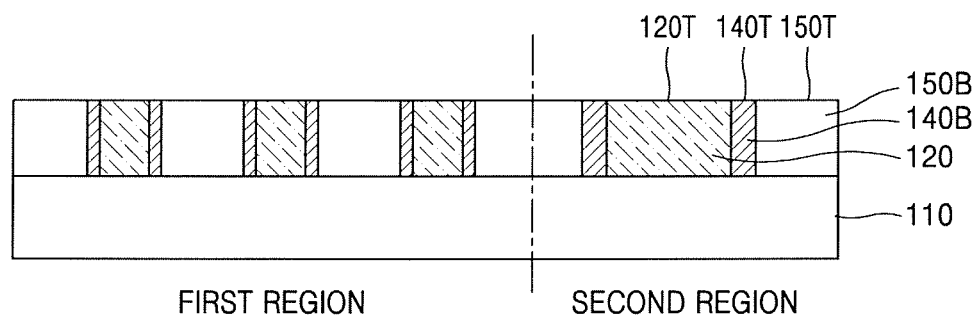

Referring to FIG. 3, second polishing may be performed on substantially the entire gate mask 130A having been subjected to the first polishing, a portion of the insulating interlayer 150A having been subjected to the first polishing, and a portion of the spacer 140A having been subjected to the first polishing using a slurry composite having a second mixing ratio through a chemical mechanical polishing process, thus forming an insulating interlayer 150B having been subjected to the second polishing and a spacer 140B having been subjected to the second polishing.

One or more exemplary embodiments of the present inventive concept include a first polishing process and a second polishing process. In the first polishing process and the second polishing process, slurry composites having substantially the same components may be used by making only mixing ratios thereof different from each other. Thus, the slurry composite used in the second polishing process may be substantially the same as the slurry composite described above, and thus duplicative descriptions may be omitted.

According to an exemplary embodiment of the present inventive concept, a polishing selection ratio of a polysilicon film may be adjusted with respect to a silicon nitride film and a silicon oxide film by adjusting a mixing ratio of a slurry composite. The slurry composite may include an abrasive, an additive capable of adjusting a polishing selection ratio, and the balance of the slurry composite may be a solvent. The second mixing ratio of the abrasive to the additive may be a ratio of approximately 0.95 to approximately 1.05. Alternatively, the second mixing ratio of the abrasive to the additive may be a ratio of approximately 2.85 to approximately 3.15. The second mixing ratio of the slurry composite may be controlled to satisfy the mixing ratio within an error range of about 5%. As an example, the second mixing ratio of the abrasive and the additive may be a ratio of about 1:3.

Substantially the entire gate mask 130A having been subjected to the first polishing may be removed to expose the upper surfaces of the plurality of dummy gates 120. According to an exemplary embodiment of the present inventive concept, the plurality of dummy gates 120 may be used as etching stop films in the second polishing process. Polishing by overetching may be performed to polish a portion of the dummy gate 120.

When the second polishing process is performed using the slurry composite obtained by mixing at the second mixing ratio, a polishing ratio of a silicon oxide film to a polysilicon film may be from about 50:1 to about 300:1. That is, polysilicon may be less likely to be etched than a silicon oxide film, and a silicon nitride film may be more likely to be etched than a silicon oxide film, and thus the plurality of dummy gates 120 including polysilicon may be used as etching stop films.

After the second polishing process is performed, an upper surface 140T of the spacer, an upper surface 150T of the insulating interlayer, and upper surfaces 120T of the plurality of dummy gates may have substantially the same level.

A gate mask may be used to form a dummy gate, and dispersion may occur in the height of a gate mask formed on an upper surface of the dummy gate. When the gate mask is removed by dry etching and/or wet etching, a portion of the gate mask need not be removed on the upper surface of the dummy gate when an etching process margin is insufficient due to the dispersion in the height of the gate mask. A portion of the remaining gate mask may cause a not-open defect of the dummy gate. A gate electrode need not be formed in the dummy gate in which a not-open defect has occurred. Excessive dry etching and/or wet etching being performed to remove substantially the entire gate mask may result in a defect in which an upper surface of a spacer is partially recessed or a defect in which the height of an insulating interlayer becomes uneven. This may result in variability in the height of the gate electrode.

Thus, when the upper surface 140T of the spacer, the upper surface 150T of the insulating interlayer, and the upper surfaces 120T of the plurality of dummy gates have substantially the same level through the first polishing process and the second polishing process according to one or more exemplary embodiments of the present inventive concept, it is possible to reduce or eliminate defects of the semiconductor device, to simplify a manufacturing process of the semiconductor device, and to reduce a manufacturing cost of the semiconductor device.

Figure 4:
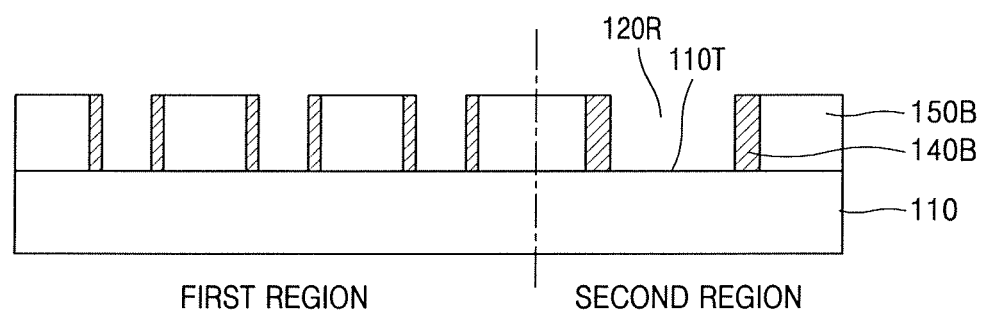

Referring to FIG. 4, a trench 120R exposing an upper surface 110T of the substrate may be formed by removing the plurality of dummy gates 120.

The etching process for removing the plurality of dummy gates 120 may be a wet etching process using, for example, ammonia, tetramethyl ammonium hydroxide (TMAH) and/or tetraethylammonium hydroxide (TEAH), but exemplary embodiments of the present inventive concept not limited thereto.

Figure 5:
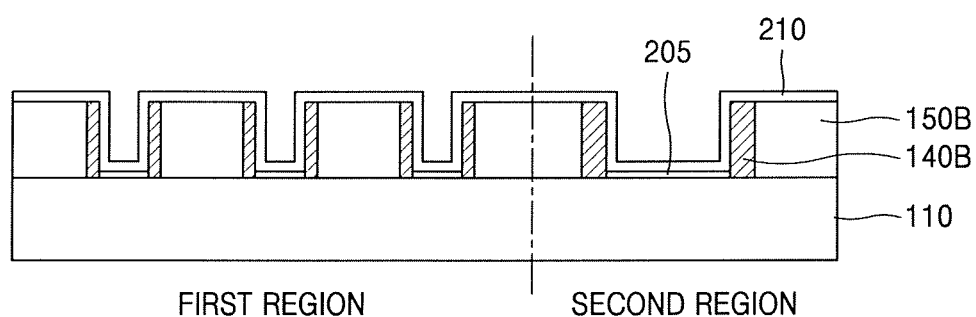

Referring to FIG. 5, an interface film 205 and a gate insulating film formation layer 210 may be formed in the trench 120R in which the upper surface 110T of the substrate is exposed.

A process of forming the interface film 205 may include a process of oxidizing a portion of the substrate 110 exposed within the trench 120R. The interface film 205 may prevent an interface defect between the gate insulating film formation layer 210 and the substrate 110. In some exemplary embodiments of the present inventive concept, the interface film 205 may include a silicon oxide film, a silicon oxynitride film, a silicate film, or a combination thereof. In some exemplary embodiments of the present inventive concept, the process of forming the interface film 205 may be omitted.

The gate insulating film formation layer 210 may be formed using an atomic layer deposition (ALD) method or a chemical oxidation formation method. The gate insulating film formation layer 210 may include a high dielectric constant material. The high dielectric constant material may include a material having a dielectric constant larger than that of a silicon oxide film. For example, the gate insulating film formation layer 210 may have a dielectric constant of from about 10 to about 25.

The high dielectric constant material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 6:
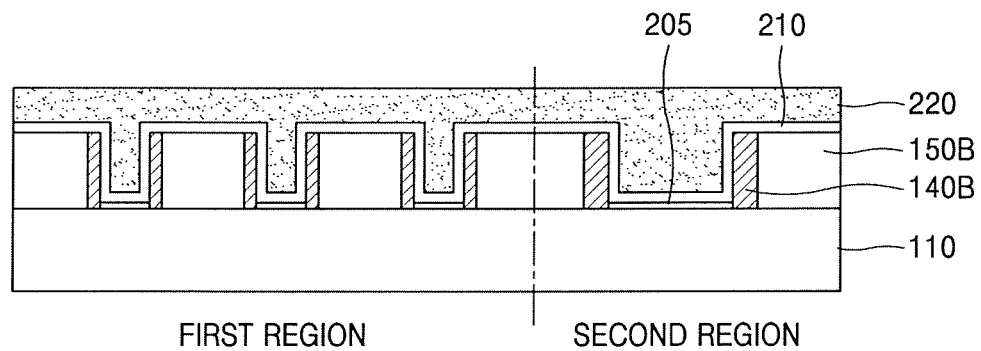

Referring to FIG. 6, a gate electrode formation layer 220 may be formed on the gate insulating film formation layer 210.

The gate electrode formation layer 220 may include titanium, titanium nitride, tantalum, tantalum nitride, tungsten, copper, aluminum, or a combination thereof. The gate electrode formation layer 220 may be formed by an atomic layer deposition (ALD), metal organic ALD (MOALD), chemical vapor deposition (CVD), metal organic CVD (MOCVD), or physical vapor deposition (PVD) process, but exemplary embodiments of the present inventive concept are not limited thereto.

Figure 7:
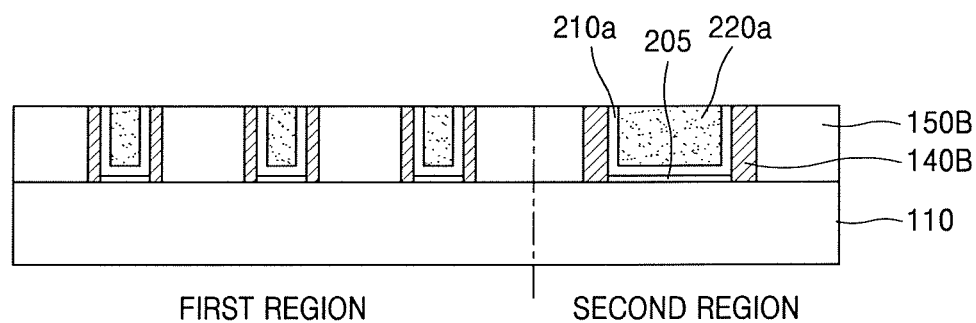

Referring to FIG. 7, the gate electrode formation layer 220 and the gate insulating film formation layer 210 may be etched to expose the upper surfaces of the insulating interlayer 150B having been subjected to the second polishing and the spacer 140B having been subjected to the second polishing, thus forming a gate electrode 220A and a gate insulating film 210A.

The gate electrode 220A and the gate insulating film 210A may be formed by flattening the gate electrode formation layer 220 and the gate insulating film formation layer 210 that are formed on the insulating interlayer 150B having been subjected to the second polishing until the upper surfaces of the insulating interlayer 150B having been subjected to the second polishing and the spacer 140B having been subjected to the second polishing are exposed.

As the process of flattening the gate electrode formation layer 220 and the gate insulating film formation layer 210, an etch back process, or a chemical mechanical polishing process may be used.

In some exemplary embodiments of the present inventive concept, to increase reliability of the gate insulating film 210A and the gate electrode 220A, a polysilicon sacrificial film for thermal treatment may be deposited on the gate insulating film 210A and the gate electrode 220A. The polysilicon sacrificial film may be thermally treated, and the polysilicon sacrificial film for thermal treatment may be removed. Thereafter, metal films may be formed on the gate electrode 220A.

Figure 8:
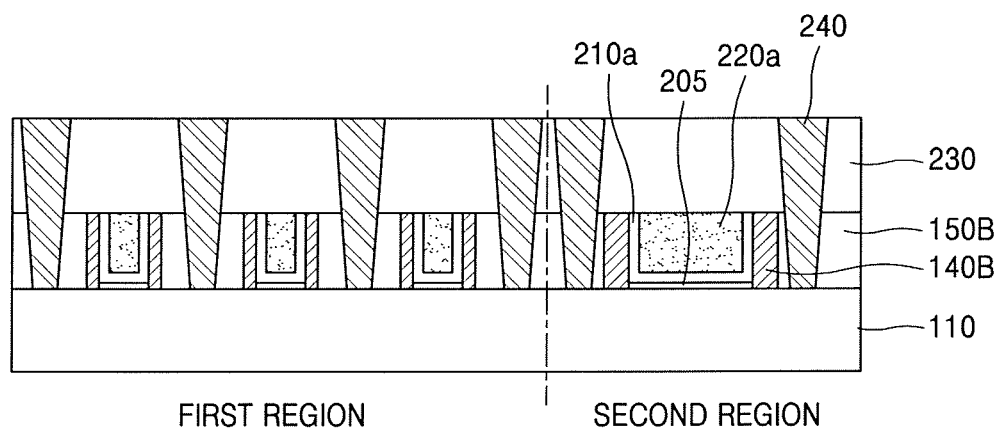

Referring to FIG. 8, an upper insulating interlayer 230 may be formed on the gate electrode 220A, the gate insulating film 210A, the spacer 140B having been subjected to the second polishing, and the insulating interlayer 150B having been subjected to the second polishing.

A contact plug 240 may be formed between the gate electrode 220A and the gate electrode 220A. The contact plug 240 may be in contact with the substrate 110. The contact plug 240 may pass through the upper insulating interlayer 230 and the insulating interlayer 150B having been subjected to the second polishing. The substrate 110 in contact with the contact plug 240 may be a source or drain region.

Figure 9:
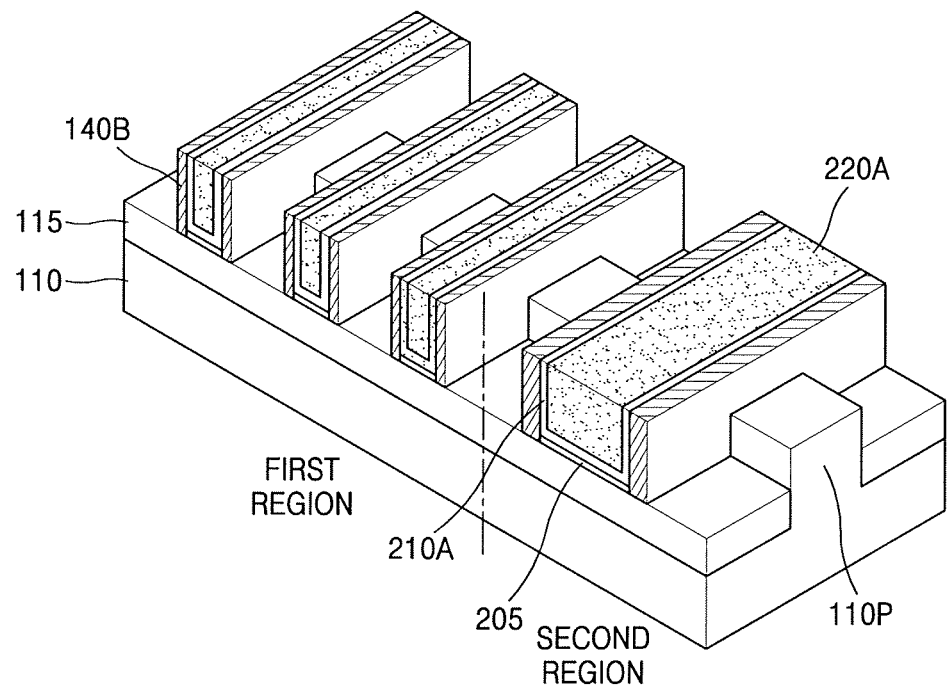
FIG. 9 is a perspective view illustrating a semiconductor device manufactured by a method of manufacturing a semiconductor device according to an exemplary embodiment of the present inventive concept.

FIG. 9 is a perspective view illustrating a semiconductor device manufactured by a method of manufacturing a semiconductor device according to an exemplary embodiment of the present inventive concept.

Referring to FIG. 9, a semiconductor device according to an exemplary embodiment of the present inventive concept may have a FinFET structure and may be manufactured by a method of manufacturing a semiconductor device according an exemplary embodiment of the present inventive concept.

A method of manufacturing a semiconductor device according an exemplary embodiment of the present inventive concept may be applied to a gate last process having a planar structure but also to a gate last process having a FinFET structure.

A method of manufacturing a semiconductor device according an exemplary embodiment of the present inventive concept will be described below in more detail. The method may be substantially the same as the method of manufacturing a semiconductor device described above, and thus duplicative descriptions may be omitted.

The substrate 110 may include a first region and a second region, and may include a protrusion portion 110P. A partial region of the substrate 110 may be covered with an element isolation film 115. The protrusion portion 110P may protrude from the upper surface of the substrate 110, may extend through the element isolation film 115 and may be exposed. The protrusion portion 110P may have a fin shape. A portion of a side surface of the protrusion portion 110P may be covered with the element isolation film 115.

The gate insulating film 210A may be disposed on the interface film 205. The gate electrode 220A may be disposed on the gate insulating film 210A. The spacer 140B having been subjected to second polishing may be disposed on at least two sides of the gate insulating film 210A. The gate electrode 220A may extend along a first direction.

The protrusion portion 110P, the gate insulating film 210A, and the gate electrode 220A may form a gate structure. The protrusion portion 110P may have a channel region formed over the upper surface and side surface of the protrusion portion 119P. Thus, it is possible to provide a channel region relatively longer than the width of the gate structure and to reduce the size of the device. When the semiconductor device having a FinFET structure is manufactured using the method of manufacturing a semiconductor device according to one or more exemplary embodiments of the present inventive concept, it is possible to simplify a manufacturing process and to reduce a manufacturing cost.

Figure 10:
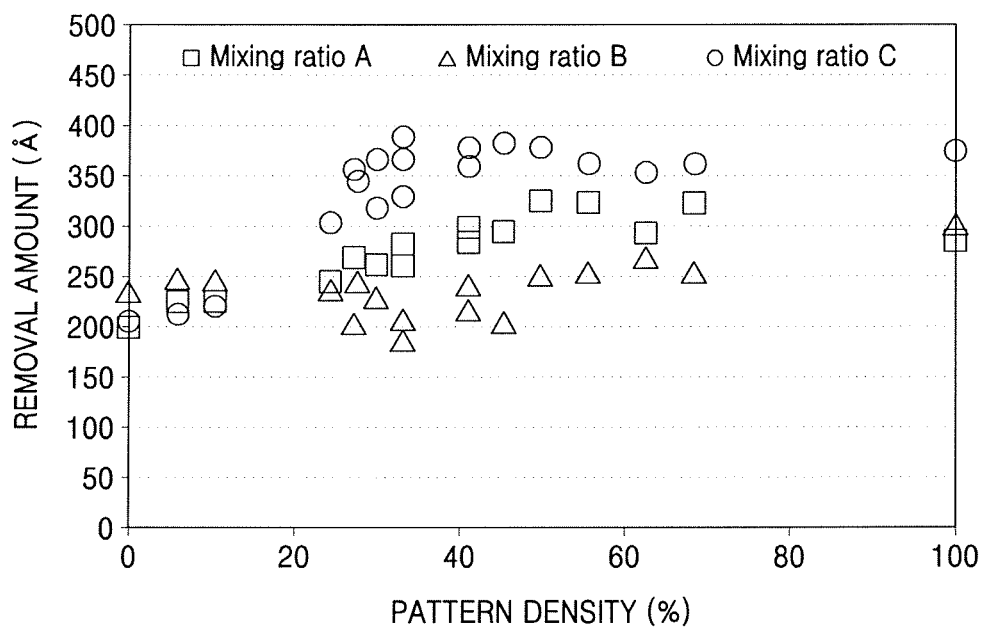
FIG. 10 is a graph illustrating an amount of polishing of a silicon nitride film depending on a mixing ratio of a slurry composite used in a method of manufacturing a semiconductor device according to an exemplary embodiment of the present inventive concept.

FIG. 10 is a graph illustrating an amount of polishing of a silicon nitride film depending on a mixing ratio of a slurry composite used in a method of manufacturing a semiconductor device according to an exemplary embodiment of the present inventive concept.

Referring to FIG. 10, in an exemplary embodiment of the present inventive concept, a gate mask may include a silicon nitride film and an insulating interlayer may include a silicon oxide film. The amount of polishing of the silicon nitride film may vary depending on a pattern density of the gate mask and a mixing ratio of a slurry composite.

Slurry composites having mixing ratios A, B, and C may be prepared, and the amount of polishing of a silicon nitride film depending on a pattern density may be measured. Thus, a first mixing ratio suitable for a first polishing process may be determined.

In the graph, the mixing ratio A shown by "□" indicates a slurry composite obtained by mixing an abrasive and an additive at a ratio of about 1:1. The mixing ratio B shown by "Δ" indicates a slurry composite obtained by mixing an abrasive and an additive at a ratio of about 1:2. The mixing ratio C shown by "○" indicates a slurry composite obtained by mixing an abrasive and an additive at a ratio of about 1:3.

The amount of polishing of the silicon nitride film may vary depending on a change in the pattern density of the gate mask. The amount of polishing of the silicon nitride film might not be relatively large and may be stabilized in the entire section of the pattern density in a case where the slurry composite having the mixing ratio B is used. The amount of polishing of the silicon nitride film may be relatively large in the entire section of the pattern density in a case where the slurry composites having the mixing ratios A and C.

Thus, in performing non-selective polishing of a silicon nitride film and a silicon oxide film in the first polishing process according to one or more exemplary embodiments of the present inventive concept, a slurry composite obtained by mixing an abrasive and an additive at a ratio of about 1:2 may be used to reduce a difference in the amount of polishing depending on the pattern density of the gate mask.

Figure 11:
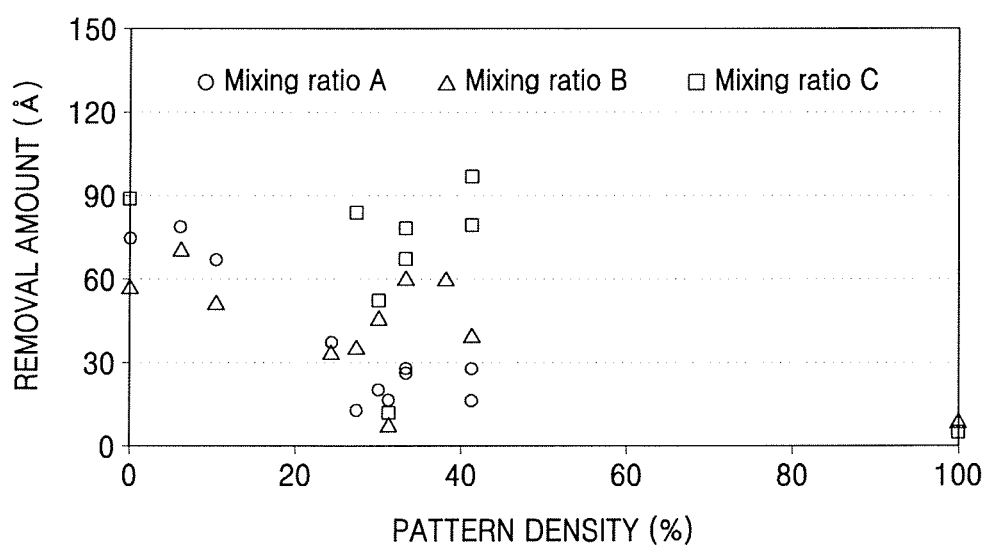
FIG. 11 is a graph illustrating an amount of polishing of a polysilicon film depending on a mixing ratio of a slurry composite used in a method of manufacturing a semiconductor device according to an exemplary embodiment of the present inventive concept.

FIG. 11 is a graph illustrating an amount of polishing of a polysilicon film depending on a mixing ratio of a slurry composite used in a method of manufacturing a semiconductor device according to an exemplary embodiment of the present inventive concept.

Referring to FIG. 11, in an exemplary embodiment of the present inventive concept in which a dummy gate includes a polysilicon film and an insulating interlayer including a silicon oxide film, the amount of polishing of the polysilicon film may vary depending on a pattern density of the dummy gate and a mixing ratio of a slurry composite.

Slurry composites having mixing ratios A, B, and C may be prepared, and the amount of polishing of a silicon nitride film depending on a pattern density may be measured. Thus, a first mixing ratio suitable for a first polishing process may be determined.

The mixing ratio A shown by "○" indicates a slurry composite obtained by mixing an abrasive and an additive at a ratio of about 1:3. The mixing ratio B shown by "Δ" indicates a slurry composite obtained by mixing an abrasive and an additive at a ratio of about 1:2. The mixing ratio C shown by "□" indicates a slurry composite obtained by mixing an abrasive and an additive at a ratio of about 1:1.

The amount of polishing of the polysilicon film may vary depending on a change in the pattern density of the dummy gate. The amount of polishing of the polysilicon film might not be relatively large in the entire section of the pattern density in a case where the slurry composite having the mixing ratio A. The amount of polishing of the polysilicon film may be relatively large in the entire section of the pattern density in a case where the slurry composites having the mixing ratios B and C.

Thus, in performing selective polishing of a silicon oxide film and a polysilicon film in the second polishing process according to one or more exemplary embodiments of the present inventive concept, a slurry composite obtained by mixing an abrasive and an additive at a ratio of about 1:2 may be used to reduce a difference in the amount of polishing depending on the pattern density of the dummy gate.

While the present inventive concept has been particularly shown and described with reference to exemplary embodiments thereof, it will be understood that various changes in form and details may be made therein without departing from the spirit and scope of the present inventive concept.

What is claimed is:

1. A method of manufacturing a semiconductor device, the method comprising:
   forming dummy gate structures on a substrate, wherein each of the dummy gate structures comprises a dummy gate and a gate mask disposed on an upper surface of the dummy gate, and wherein spacers are disposed on at least two sides of each of the dummy gate structures;
   forming an insulating interlayer on the gate mask and the spacer;
   performing a first polishing including chemical mechanical polishing on portions of the gate mask, the spacers, and the insulating interlayer, wherein a polishing ratio of the gate mask and the spacers to the insulating interlayer is 1:1 to 2:1; and
   performing a second polishing including chemical mechanical polishing on remaining portions of the gate mask and the insulating interlayer to expose upper surfaces of each of the dummy gates, wherein a polishing ratio of the insulating interlayer to the dummy gate is 50:1 to 300:1.

2. The method of claim 1, wherein the first polishing uses a slurry composite having a first mixing ratio and the second polishing uses a slurry composite having a second mixing ratio,
   wherein the slurry composite comprises an abrasive and an additive capable of adjusting a polishing selection ratio, wherein the slurry composite is dispersed in a solvent,
   wherein the first mixing ratio of the abrasive and the additive is a ratio of 0.95 to 1.05:1.9 to 2.1, and
   wherein the second mixing ratio of the abrasive and the additive is a ratio of 0.95 to 1.05:2.85 to 3.15.

3. The method of claim 2, wherein the abrasive comprises at least one selected from silica, alumina, ceria, zirconia, and titania.

4. The method of claim 2, wherein the additive comprises a silicon nitride film polishing accelerator, a polysilicon film polishing restrainer, a silicon oxide film polishing regulator, and a planarization regulator,
   wherein the silicon nitride film polishing accelerator comprises at least one selected from isoleucine, alanine, glycine, glutamine, threonine, serine, asparagine, tyrosine, cysteine, valine, and leucine,
   wherein the polysilicon film polishing restrainer comprises an anionic polymer comprising at least one selected from polyacrylic acid, polyacrylic acid ammonium salt, polymethacrylic acid, polymethacrylic acid ammonium salt, and poly acrylic maleic acid,
   wherein the silicon oxide film polishing regulator comprises at least one selected from 1-2-hydroxyethyl-2-pyrrolidone, 4-hydroxyethyl-2-pyrrolidone, maleic anhydride, maleic hydrazide, and malemide, and
   wherein the planarization regulator comprises an nonionic polymer comprising at least one selected from polyvinyl alcohol (PVA), ethylene glycol (EG), glycerin, polyethylene glycol (PEG), polypropylene glycol (PPG), and polyvinyl pyrrolidone (PVP).

5. The method of claim 1, wherein the gate mask comprises a silicon nitride film, each of the spacers comprises a silicon nitride film, each of the dummy gates comprises a polysilicon film, and the insulating interlayer comprises a silicon oxide film.

6. The method of claim 1, wherein the substrate comprises a first region and a second region,
   wherein a thickness of at least one gate mask in the first region is different from a thickness of the gate mask in the second region.

7. The method of claim 1, wherein the substrate comprises a first region and a second region,
   wherein each of the dummy gates has a first width in the first region and a second width in the second region, wherein the first width is different from the second width.

8. The method of claim 1, wherein performing the first polishing forms upper surfaces of remaining portions of the gate mask and the insulating interlayer to have a substantially same level.

9. The method of claim 1, wherein the spacers are disposed on at least two sides of the dummy gate and on at least two sides of the gate mask, wherein the at least two sides of the dummy gate and the at least two sides of the gate mask are substantially orthogonal to an upper surface of the substrate.

10. A method of manufacturing a semiconductor device, the method comprising:
    providing a substrate comprising a first region and a second region;
    forming dummy gate structures on the substrate, wherein each of the dummy gate structures comprises a dummy gate and a gate mask disposed on an upper surface of the dummy gate, wherein spacers are disposed on opposite side surfaces of each of the dummy gate structures, and wherein each of the dummy gates has a first width in the first region and a second width in the second region, wherein the first width is different from the second width;
    forming an insulating interlayer on the gate mask and the spacer;
    performing a first polishing including chemical mechanical polishing on portions of the gate mask, the spacers, and the insulating interlayer, wherein a polishing ratio of the gate mask and the spacers to the insulating interlayer is 1:1 to 2:1; and
    performing a second polishing including chemical mechanical polishing on remaining portions of the gate mask and the insulating interlayer to stop polishing on the upper surfaces of the dummy gates, wherein a polishing ratio of the insulating interlayer to the dummy gate is 50:1 to 300:1.

11. The method of claim 10, wherein the first polishing uses a slurry composite having a first mixing ratio and the second polishing uses a slurry composite having a second mixing ratio, wherein materials included in the slurry composites used in the performing of the first polishing and the second polishing are substantially the same as each other, wherein each of the slurry composites comprises an abrasive and an additive capable of adjusting a polishing selection ratio, wherein the slurry composite is dispersed in a solvent, wherein the first mixing ratio of the abrasive and the additive is a ratio of 0.95 to 1.05:1.9 to 2.1, and wherein the second mixing ratio of the abrasive and the additive is a ratio of 0.95 to 1.05:2.85 to 3.15.

12. The method of claim 10, wherein the gate mask comprises a silicon nitride film, each of the spacers comprises a silicon nitride film, each of the dummy gates comprises a polysilicon film, the insulating interlayer comprises a silicon oxide film, the gate insulating film comprises a high dielectric constant material, and the gate electrode comprises at least one selected from titanium, titanium nitride, tantalum, tantalum nitride, tungsten, copper, aluminum, or a combination thereof.

13. The method of claim 10, wherein a thickness of at least one gate mask in the first region is different from a thickness of the gate mask in the second region.

14. The method of claim 10, wherein performing the first polishing forms upper surfaces of remaining portions of the gate mask and the insulating interlayer to have a substantially same level.

15. The method of claim 10, wherein the spacers are disposed on at least two sides of the dummy gate and on at least two sides of the gate mask, wherein the at least two sides of the dummy gate and the at least two sides of the gate mask are substantially orthogonal to an upper surface of the substrate.

16. The method of claim 10, further comprising:
forming a trench exposing the substrate by removing the dummy gate;
forming a gate insulating film on a lower surface of the trench; and
forming a gate electrode on the gate insulating film.

17. A method of manufacturing a semiconductor device, the method comprising:
forming dummy gate structures on a substrate, wherein each of the dummy gate structures comprises a dummy gate and a gate mask disposed on an upper surface of the dummy gate, and wherein spacers are disposed on at least two sides of each of the dummy gate structures;
forming an insulating interlayer on each of the gate masks and each of the spacers;
performing a first polishing including chemical mechanical polishing on portions of the gate mask and the insulating interlayer to form upper surfaces of remaining portions of the gate mask and the insulating interlayer to have a substantially same level, wherein a polishing ratio of the gate mask to the insulating interlayer is 1:1 to 2:1; and
performing a second polishing including chemical mechanical polishing on remaining portions of the gate mask and the insulating interlayer to expose upper surfaces of dummy gates, wherein a polishing ratio of the insulating interlayer to the dummy gate is 50:1 to 300:1.

18. The method of claim 17, wherein the substrate comprises a first region and a second region,
wherein a thickness of at least one gate mask in the first region is different from a thickness of the gate mask in the second region.

19. The method of claim 17, wherein the substrate comprises a first region and a second region,
wherein each of the dummy gates has a first width in the first region and a second width in the second region, wherein the first width is different from the second width.

20. The method of claim 17, wherein the spacers are disposed on at least two sides of the dummy gate and on at least two sides of the gate mask, wherein the at least two sides of the dummy gate and the at least two sides of the gate mask are substantially orthogonal to an upper surface of the substrate.

* * * * *